United States Patent
Chen et al.

(10) Patent No.: US 9,720,032 B2
(45) Date of Patent: Aug. 1, 2017

(54) AUTOMATED TEST PLATFORM FOR TESTING SHORT CIRCUITS

(71) Applicant: Xcerra Corporation, Norwood, MA (US)

(72) Inventors: Wai-Kong Chen, Fremont, CA (US); David Harris, San Jose, CA (US)

(73) Assignee: Xcerra Corporation, Norwood, MA (US)

( * ) Notice: Subject to any disclaimer, the term of this patent is extended or adjusted under 35 U.S.C. 154(b) by 252 days.

(21) Appl. No.: 14/674,479

(22) Filed: Mar. 31, 2015

(65) Prior Publication Data

US 2016/0291057 A1  Oct. 6, 2016

(51) Int. Cl.
- *G01R 31/26* (2014.01)
- *G01R 31/28* (2006.01)
- *G01R 31/319* (2006.01)

(52) U.S. Cl.
CPC ... *G01R 31/2834* (2013.01); *G01R 31/31926* (2013.01)

(58) Field of Classification Search
CPC .............. G01R 15/002; G01R 19/0084; G01R 19/2503; G01R 19/257; G01R 31/3181; G01R 31/2801; G01R 31/2886; G01R 31/024; G01R 31/3172
See application file for complete search history.

(56) References Cited

U.S. PATENT DOCUMENTS

| | | | | |
|---|---|---|---|---|
| 5,652,524 | A * | 7/1997 | Jennion | G01R 31/2801 324/756.07 |
| 6,347,287 | B1 * | 2/2002 | Beckett | G11C 29/56 324/617 |
| 6,842,029 | B2 * | 1/2005 | Howland | G01R 31/2886 324/750.25 |
| 6,971,045 | B1 * | 11/2005 | Deb | G01R 31/3172 714/27 |
| 7,026,822 | B1 * | 4/2006 | Bald | G01R 31/024 307/134 |
| 2005/0231228 | A1 * | 10/2005 | Mattes | G01R 31/31932 324/750.02 |
| 2013/0006567 | A1 * | 1/2013 | Horn | G01R 31/31907 702/108 |
| 2013/0342236 | A1 * | 12/2013 | Song | G01R 1/0408 324/756.07 |

* cited by examiner

*Primary Examiner* — Minh N Tang
(74) *Attorney, Agent, or Firm* — Brian J. Colandreo; Michael T. Abramson; Holland & Knight LLP

(57) ABSTRACT

An automated test platform for testing a first device under test includes N voltage sources for providing N different voltages. A cross matrix switching system is coupled to the N voltage sources, the cross matrix switch being configured to provide the N different voltages to M discrete test points within the first device under test, wherein M is larger than N. An N voltage measuring system is coupled to the first device under test, the N voltage measuring system being configured to measure the voltage potential present on the M discrete test points.

19 Claims, 4 Drawing Sheets

US 9,720,032 B2

AUTOMATED TEST PLATFORM FOR TESTING SHORT CIRCUITS

TECHNICAL FIELD

This disclosure relates to automated test equipment and, more particularly, to automated test equipment that applies voltages to numerous test points.

BACKGROUND

Automated test equipment systems may be used to test various electronic components, which are often referred to as devices under test. Such systems may automate the testing of such components, wherein a component may be subjected to a battery of different tests in some form of logical fashion. Additionally, such systems may provide further levels of automation, wherein the components being tested may be automatically swapped out (upon completion of a testing procedure) and replaced with a component that is yet to be tested. Unfortunately, such automated test equipment systems are often required to provide a high quantity of test signals to numerous test points within the devices under test, often requiring the automated test equipment systems to include a high quantity of voltage sources.

SUMMARY OF DISCLOSURE

In one implementation, an automated test platform for testing a first device under test includes N voltage sources for providing N different voltages. A cross matrix switching system is coupled to the N voltage sources, the cross matrix switch being configured to provide the N different voltages to M discrete test points within the first device under test, wherein M is larger than N. An N voltage measuring system is coupled to the first device under test, the N voltage measuring system being configured to measure the voltage potential present on the M discrete test points.

One or more of the following features may be included. An automated switch activation system may be configured to effectuate a switching sequence on the cross matrix switching system that selectively applies the N different voltages to the M discrete test points. The switching sequence may be a static switching sequence. The switching sequence may be an automated switching sequence. The cross matrix switching system may include N cross point switches, wherein each N cross point switch is coupled to one of the N voltage sources. Each of the N cross point switches may include M outputs, wherein each of the M outputs may be selectively coupleable to the M discrete test points within the first device under test. The cross matrix switching system may be configured to releasable engage the first device under test. The N voltage measuring system may include a plurality of analog-to-digital converters coupled to the M discrete test points within the first device under test. The N voltage measuring system may be configured to releasable engage the first device under test. An automated DUT swap system may be configured to: uncouple the first device under test from the automated test platform, and couple a second device under test to the automated test platform.

In another implementation, an automated test platform for testing a first device under test includes N voltage sources for providing N different voltages. A cross matrix switching system is coupled to the N voltage sources, the cross matrix switching system being configured to provide the N different voltages to M discrete test points within the first device under test, wherein M is larger than N. An automated switch activation system is configured to effectuate a switching sequence on the cross matrix switching system that selectively applies the N different voltages to the M discrete test points. An N voltage measuring system is coupled to the first device under test, the N voltage measuring system being configured to measure the voltage potential present on the M discrete test points. The N voltage measuring system includes a plurality of analog-to-digital converters coupled to the M discrete test points within the first device under test.

One or more of the following features may be included. The switching sequence may be a static switching sequence. The switching sequence may be an automated switching sequence. The cross matrix switching system may include N cross point switches, wherein each N cross point switch may be coupled to one of the N voltage sources. Each of the N cross point switches may include M outputs, wherein each of the M outputs may be selectively coupleable to the M discrete test points within the first device under test. An automated DUT swap system may be configured to: uncouple the first device under test from the automated test platform, and couple a second device under test to the automated test platform.

In another implementation, an automated test platform for testing a first device under test includes N voltage sources for providing N different voltages. A cross matrix switching system is coupled to the N voltage sources, the cross matrix switch being configured to provide the N different voltages to M discrete test points within the first device under test, wherein M is larger than N. An automated switch activation system is configured to effectuate a switching sequence on the cross matrix switching system that selectively applies the N different voltages to the M discrete test points. The switching sequence includes one of: a static switching sequence, and an automated switching sequence. An N voltage measuring system is coupled to the first device under test. The N voltage measuring system is configured to measure the voltage potential present on the M discrete test points. The N voltage measuring system includes a plurality of analog-to-digital converters coupled to the M discrete test points within the first device under test. An automated DUT swap system is configured to: uncouple the first device under test from the automated test platform, and couple a second device under test to the automated test platform.

One or more of the following features may be included. The cross matrix switching system may include N cross point switches, wherein each N cross point switch may be coupled to one of the N voltage sources. Each of the N cross point switches may include M outputs, wherein each of the M outputs may be selectively coupleable to the M discrete test points within the first device under test. The cross matrix switching system may be configured to releasable engage the first device under test and the N voltage measuring system may be configured to releasable engage the first device under test.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE PREFERRED EMBODIMENTS

Figure 1:
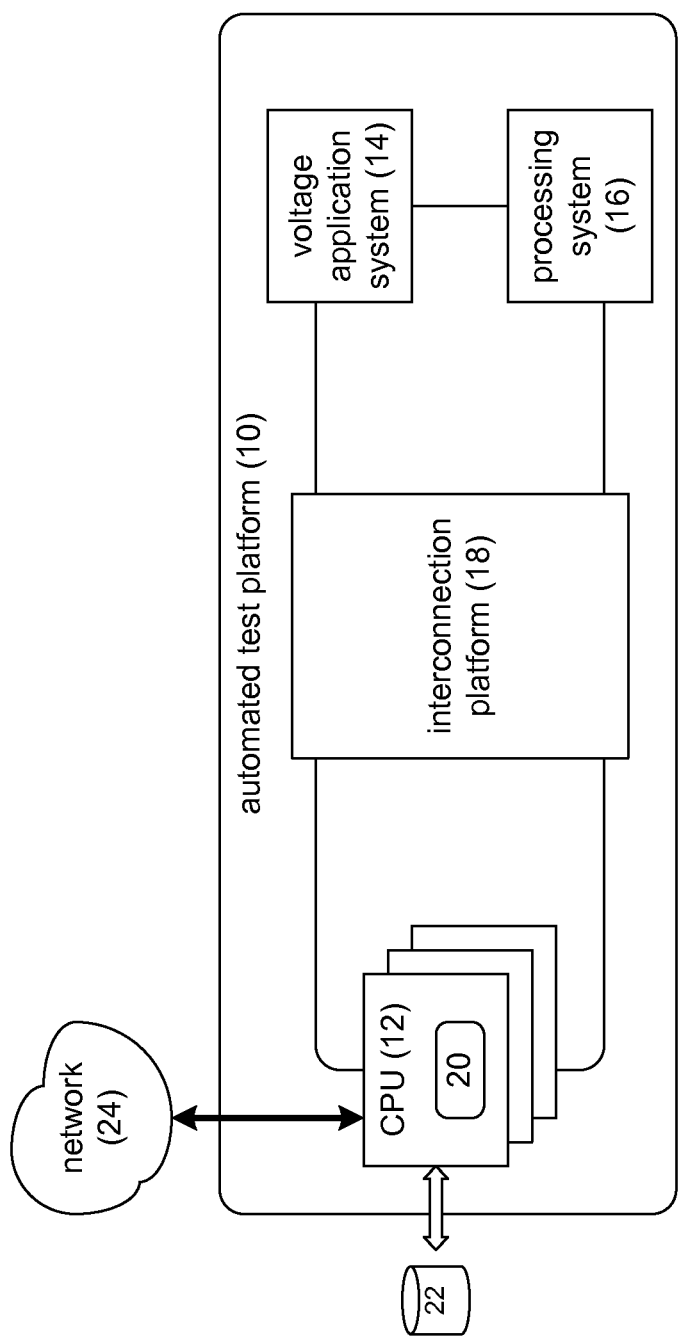
FIG. 1 is a diagrammatic view of an automated test platform.

System Overview:

Referring to FIG. 1, there is shown automated test platform 10. Examples of automated test platform 10 may include, but are not limited to, systems that automate the verification and validation of devices under test (DUTs). As discussed above, automated test equipment systems (e.g. automated test platform 10) may be used to test various electronic components in an automated fashion. Typically, the devices under test are subjected to a battery of different tests, wherein the testing procedures are automated in a logical fashion. For example, during the testing of a power supply, the power supply may be subjected to varying voltage levels and varying voltage frequencies. Further, during the testing of a noise canceling circuit, such a circuit may be subjected to varying levels and frequencies of noise to confirm the satisfactory performance of the same.

Automated test platform 10 may include one or more central processing units (e.g. CPU subsystem 12), one or more voltage application subsystems (e.g. voltage application system 14), and one or more processing subsystems (e.g. processing system 16), all of which may be coupled together via interconnection platform 18 (e.g., a PCIe bus). If configured as a PCIe bus, interconnection platform 18 may allow for voltage application system 14 and processing system 16 to communicate via interconnection platform 18 using the PCIe communication standards. As is known in the art, PCIe (Peripheral Component Interconnect Express) is a high-speed serial computer expansion bus standard designed to replace older bus systems (e.g., PCI, PCI-X, and AGP). Through the use of PCIe, higher maximum system bus throughput may be achieved. Other benefits may include lower I/O pin count, a smaller physical footprint, better performance-scaling for bus devices, a more detailed error detection and reporting mechanism, and native plug-n-play functionality.

Examples of CPU subsystem 12 may include but are not limited to a personal computer, a server computer, a series of server computers, a mini computer or a single-board computer. CPU subsystem 12 may execute one or more operating systems, examples of which may include but are not limited to: Microsoft Windows Server™; Redhat Linux™, Unix, or a custom operating system, for example. While in this particular example, automated test platform 10 is shown to include three CPU subsystems, this is for illustrative purposes only and is not intended to be a limitation of this disclosure, as other configurations are possible. For example, the number of CPU subsystems utilized within automated test platform 10 may be increased or decreased depending upon the anticipated loading of automated test platform 10.

CPU subsystem 12 may execute one or more automated test programs (e.g. automated test process 20), wherein automated test process 20 may be configured to automate the testing of various devices under test. Through the use of automated test process 20, an administrator (not shown) of automated test platform 10 may define and execute testing procedures/routines for the various devices under test.

The instruction sets and subroutines of automated test process 20, which may be stored on storage device 22 included within CPU subsystem 12, may be executed by one or more processors (not shown) and one or more memory architectures (not shown) included within CPU subsystem 12. Storage device 22 may include but is not limited to: a hard disk drive; a tape drive; an optical drive; a RAID device; a random access memory (RAM); a read-only memory (ROM); and all forms of flash memory storage devices.

CPU subsystem 12 may be connected to one or more networks (e.g., network 24), examples of which may include but are not limited to: a local area network, a wide area network, an intranet or the internet, for example. Accordingly, CPU subsystem 12 may be administered and/or controlled via network 24. Accordingly, an administrator (not shown) may use a remote computer (not shown) coupled to network 24 to define and/or administer various testing procedures and/or routines via automated test process 20.

Figure 2:
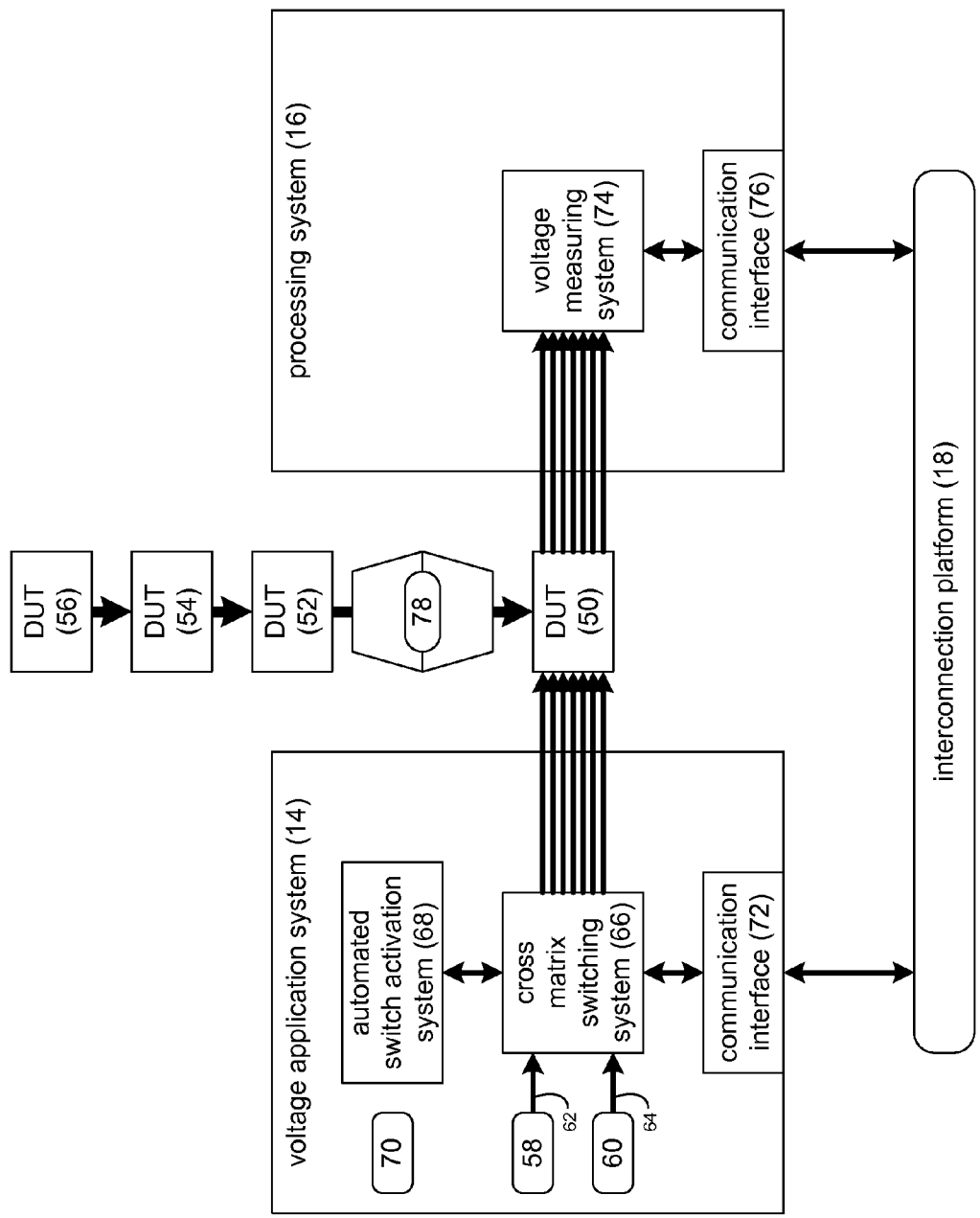
FIG. 2 is a diagrammatic view of a voltage application system and a processing system included within the automated test platform of FIG. 1.

Referring also to FIG. 2, there is shown a more detailed view of voltage application system 14 and processing system 16. As discussed above, automated test platform 10 may be used to test various devices under test. For example, assume for illustrative purposes that voltage application system 14 and processing system 16 are being used to test devices under test 50, 52, 54, 56 in a sequential fashion.

Voltage application system 14 may include N voltage sources (e.g., voltage sources 58, 60) for providing N different voltages (e.g., voltages 62, 64) for use during a testing procedure effectuated by automated test platform 10. While the following example concerns voltage application system 14 including two voltage sources (e.g., voltage sources 58, 60) that provide two different voltages (e.g., voltages 62, 64) for a testing procedure, this is for illustrative purposes only and is not intended to be a limitation of this disclosure, as other configurations are possible and are considered to be within the scope of this disclosure. For example, the quantity of voltage sources and the quantity of voltages provided may be increased or decreased depending upon the design criteria and intended use of automated test platform 10. Illustrative values of voltages 62, 64 may include but they are not limited to 0.0 VDC volts for voltage 62 and −2.0 VDC volts for voltage 64.

Voltage application system 14 may include cross matrix switching system 66 coupled to the N voltage sources (e.g., voltage sources 58, 60). As will be discussed below in greater detail, cross matrix switching system 66 may be configured to provide the N different voltages (e.g., voltages 62, 64) to M discrete test points within the first device under test (e.g., device under test 50), wherein the value of M may be larger than the value of N. For example and as discussed above, a typical value for N (i.e., the number of voltage sources and the number of voltages) may be two. However, a typical value for M (i.e., the number of discrete test points within the first device under test (e.g., device under test 50) may be several thousand.

Voltage application system 14 may include an automated switch activation system (e.g., automated switch activation system 68) that may be configured to effectuate a switching sequence (e.g., switching sequence 70) on cross matrix switching system 66 that selectively applies the N different voltages to the M discrete test points. Switching sequence 70 may be a static switching sequence (e.g., a switching sequence that remain static and does not change connections during a testing procedure) or an automated switching sequence (e.g., a switching sequence that changes and varies the connections during a testing procedure).

Cross matrix switching system 66 may be configured to releasable engage the first device under test (e.g., device under test 50), thus allowing for temporary electrical connectivity between e.g., device under test 50 and cross matrix switching system 66.

Voltage application system 14 may include communication interface system 72, wherein communication interface system 72 may be configured to couple voltage application system 14 with interconnection platform 18, thus allowing for communication with e.g., CPU 12.

Processing system 16 may include an N voltage measuring system (e.g., voltage measuring system 74) coupled to the first device under test (e.g., device under test 50). As will be discussed below in greater detail, the N voltage measuring system (e.g., voltage measuring system 74) may be configured to measure the voltage potential present on the above-described M discrete test points.

Voltage measuring system 74 may be configured to releasable engage the first device under test (e.g., device under test 50), thus allowing for temporary electrical connectivity between e.g., device under test 50 and voltage measuring system 74.

Measuring system 16 may include communication interface system 76, wherein communication interface system 76 may be configured to couple processing system 16 with interconnection platform 18, thus allowing for communication with e.g., CPU 12.

Automated test platform 10 may include automated DUT swap system 78 that may be configured to uncouple the first device under test (e.g., device under test 50) from automated test platform 10, and couple a second device under test (e.g., device under test 52) to automated test platform 10. An example of automated DUT swap system 78 may include but is not limited to a robotic arm (or similar device) that may be configured to remove the first device under test (e.g., device under test 50) from automated test platform 10 upon e.g., the completion of a testing procedure and couple the second device under test (e.g., device under test 52) to automated test platform 10 so that e.g., the testing procedure could be performed on device under test 52.

Figure 3:
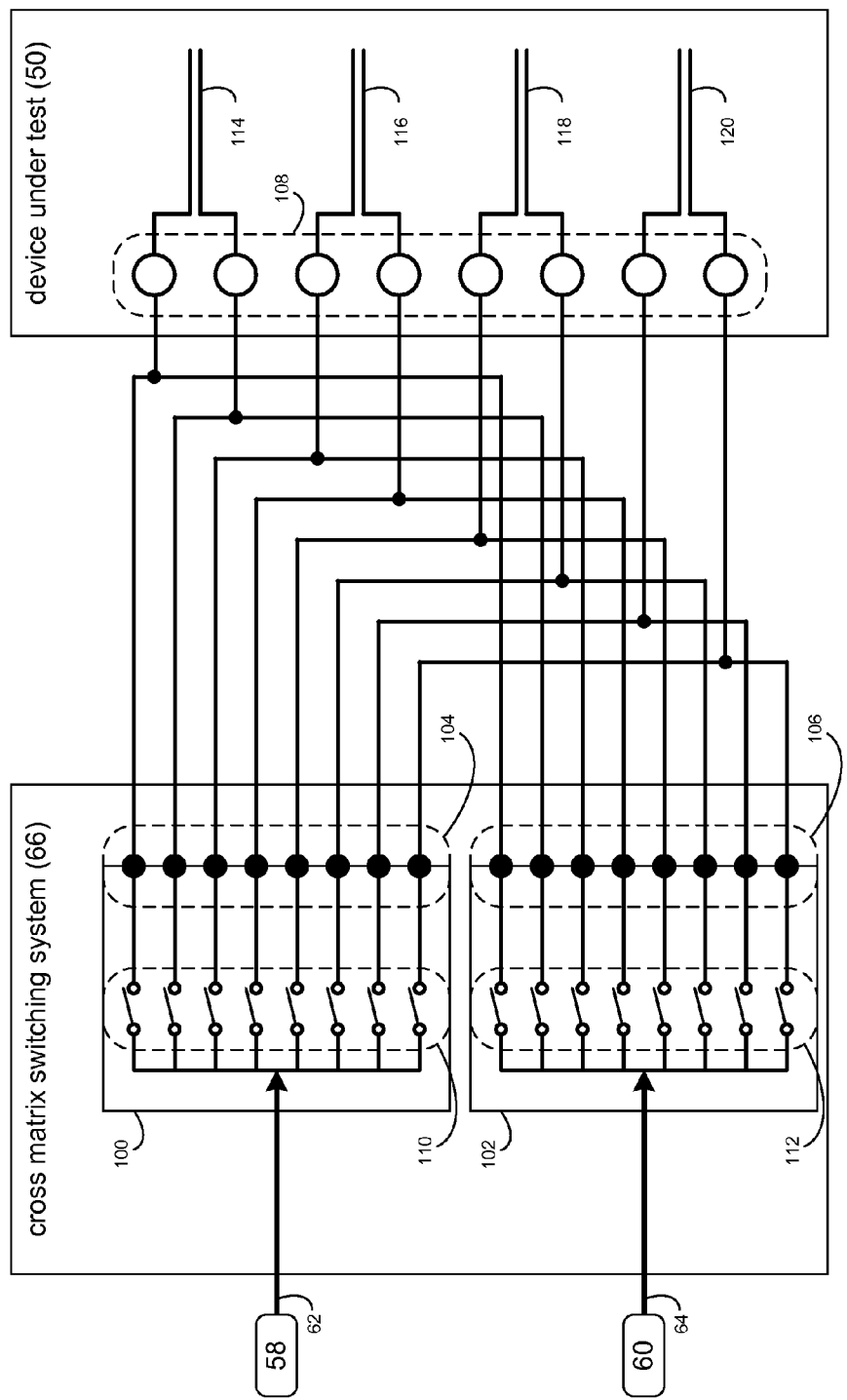
FIG. 3 is a diagrammatic detail view of the voltage application system included within the automated test platform of FIG. 1.

Referring also to FIG. 3, cross matrix switching system 66 may include N cross point switches (e.g., cross point switches 100, 102), wherein each N cross point switch (e.g., cross point switches 100, 102) may be coupled to one of the N voltage sources (e.g., voltage sources 58, 60). For example, cross point switch 100 may be coupled to voltage source 58, while cross point switch 102 may be coupled to voltage source 60. Each of the N cross point switches (e.g., cross point switches 100, 102) may include M outputs (e.g., outputs 104, 106, respectively). Cross point switch 100 may be configured to allow voltage source 58 to be coupled to any (or all) of outputs 104, while cross point switch 102 may be configured to allow voltage source 60 to be coupled to any (or all) of outputs 106.

For this particular example and for ease of illustration, the number of outputs of each cross point switch (e.g., cross point switches 100, 102) is shown to be eight, even though (and as discussed above) cross point switches 100, 102 may include several thousand outputs in a typical application.

Each of the M outputs (e.g., outputs 104, 106, respectively) included within cross point switches 100, 102 (respectively) may be selectively coupleable to M discrete test points (e.g., test points 108) include within e.g., the first device under test (e.g., device under test 50). Specifically, cross point switch 100 is shown to include discrete switches 110 that may be controllable by automated test platform 10 (generically) and automated switch activation system 68 (specifically), thus allowing automated test platform 10 to provide voltage source 58 to any (or all) of test points 108. Further, cross point switch 102 is shown to include discrete switches 112 that may be controllable by automated test platform 10 (generically) and automated switch activation system 68 (specifically), thus allowing automated test platform 10 to provide voltage source 60 to any (or all) of test points 108.

Figure 4:
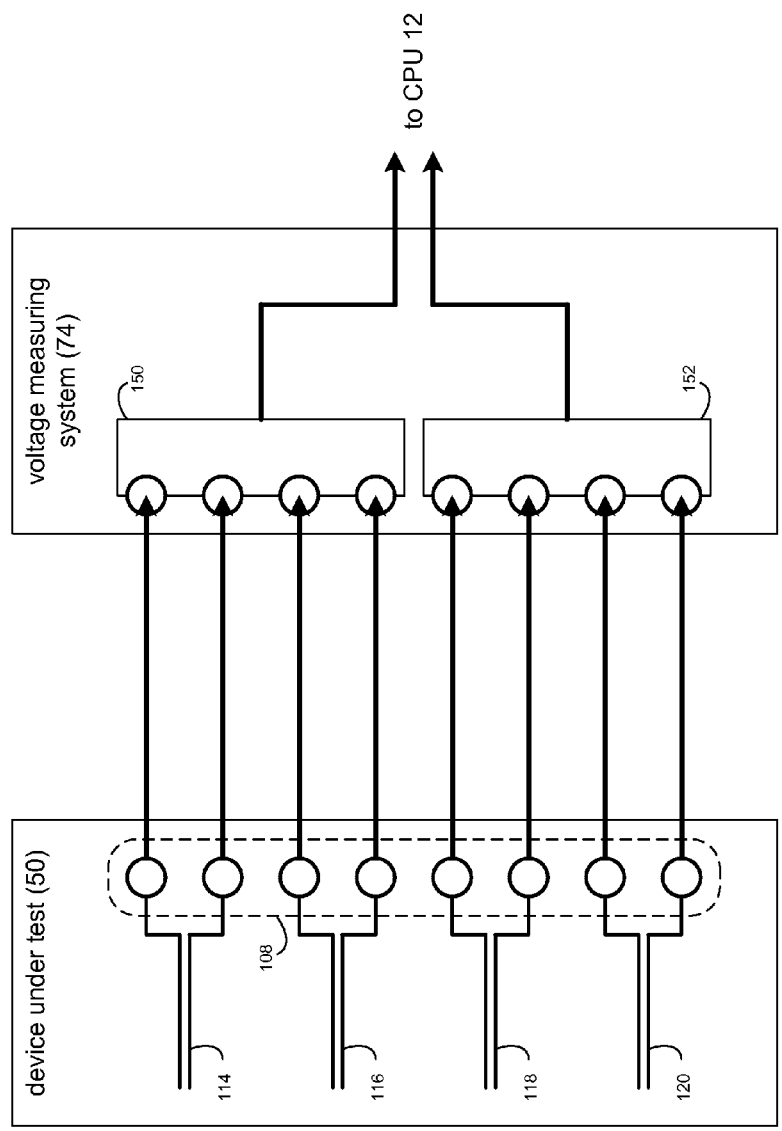
FIG. 4 is a diagrammatic detail view of the processing system included within the automated test platform of FIG. 1.

Referring also to FIG. 4, the N voltage measuring system (e.g., voltage measuring system 74) may include a plurality of analog-to-digital converters (e.g., analog to digital converters 150, 152) coupled to the M discrete test points (e.g., test points 108) include within e.g., the first device under test (e.g., device under test 50). The combination of analog to digital converters 150, 152 may determine the voltage present on each of test points 108.

General Operation:

While the following discussion concerns one example of the manner in which automated test platform 10 may perform, this is for illustrative purposes and is not intended to be limiting concerning this disclosure. Accordingly automated test platform 10 may be configured to perform in varying ways, all of which are considered to be within the scope of this disclosure.

As discussed above, automated test platform 10 may be used to test various electronic components. CPU subsystem 12 may execute one or more automated test programs (e.g. automated test process 20), wherein automated test process 20 may be configured to automate the testing of e.g., devices under test 50, 52, 54, 56. Through the use of automated test process 20, an administrator (not shown) of automated test platform 10 may define testing procedures/routines for devices under test 50, 52, 54, 56, which may be performed by automated test platform 10.

Assume for illustrative purposes that devices under test 50, 52, 54, 56 are flat panel display driver chips. As is known in the art, current and existing solutions for flat panel display driver chips may consist of thousands of source channels. Depending upon the types of panel that the panel display driver chip is designed for, the number of source channels may vary greatly. For example, the HD resolution (720) LTPS (Low Temperature Poly-Silicon) display panel may require 720 source channels. Further, full HD resolution (1080) may require 1080 source channels. And for A-SI (Amorphous Silicon) display panels, each pixel may require three source channels. Accordingly, the same HD resolution panel may require 2,160 source channels and the Full HD panel may require 3,240 source channels.

Accordingly, conductive traces 114, 116, 118, 120 within devices under test 50, 52, 54, 56 may be in very close proximity to each other (often separated by only a few microns). Therefore, automated test platform 10 may be configured to confirm that none of these traces are shorted with respect to each other.

For example, device under test 50 may be positioned within automated test platform 10, wherein cross matrix switching system 66 and voltage measuring system 74 may be configured to releasable engage the first device under test (e.g., device under test 50), thus allowing for temporary electrical connectivity between e.g., device under test 50, cross matrix switching system 66 and voltage measuring system 74.

As discussed above, voltage 62 may be configured to be substantially larger than voltage 64. Further, cross point switch 100 may be configured to provide voltage 62 to e.g., the odd number traces included within conductive traces 114, 116, 118, 120, while cross point switch 102 may be configured to provide voltage 64 to e.g., the even number traces included within conductive traces 114, 116, 118, 120. Accordingly and for conductive traces 114, 116, 118, 120, the voltage in adjacent conductive traces will alternate from higher voltage 62 to lower voltage 64. Therefore, one conductive trace within each of conductive traces 114, 116, 118, 120 will have voltage 62 applied to it, while the other conductive trace included within conductive traces 114, 116, 118, 120 will have voltage 64 applied to it.

The plurality of analog-to-digital converters (e.g., analog to digital converters 150, 152) included within the N voltage measuring system (e.g., voltage measuring system 74) may determine the voltage present on each of test points 108. In the event that none of conductive traces 114, 116, 118, 120 are shorted to each other, the voltages sensed on test points 108 will alternate from higher voltage 62 to lower voltage 64. However, in the event that one or more of conductive traces 114, 116, 118, 120 are shorted with each other, the voltages sensed on test points 108 will not alternate from higher voltage 62 to lower voltage 64, as shorted conductive traces will be at higher voltage 62 (instead of being at lower voltage 64). This voltage information may be provided to CPU 12 for processing to determine whether the device under test (e.g., one or more of devices under test 50, 52, 54, 56) are defective due to shorted conductive traces.

As discussed above, automated test platform 10 may include automated DUT swap system 78 that may be configured to uncouple the first device under test (e.g., device under test 50) from automated test platform 10, and couple a second device under test (e.g., device under test 52) to automated test platform 10, thus allowing for sequential automated testing of multiple devices under test.

General:

As will be appreciated by one skilled in the art, the present disclosure may be embodied as a method, a system, or a computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. The computer-usable or computer-readable medium may also be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, RF, etc.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network/a wide area network/the Internet.

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer/special purpose computer/other programmable data processing apparatus, such that the instructions, which execute via the processor of the computer or other programmable data processing apparatus, create means for implementing the functions/acts specified in the flowchart and/or block diagram block or blocks.

These computer program instructions may also be stored in a computer-readable memory that may direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowcharts and block diagrams in the figures may illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. An automated test platform for testing a first device under test, the automated test platform comprising:
    N voltage sources for providing N different voltages;
    a cross matrix switching system coupled to the N voltage sources, the cross matrix switching system configured to provide the N different voltages to M discrete test points within the first device under test, wherein M is larger than N, and wherein the N different voltages includes at least a first voltage from a first voltage source of the N voltage sources and a second voltage from a second voltage source of the N voltage sources;
    an automated switch activation system configured to effectuate a switching sequence on the cross matrix switching system that selectively applies the N different voltages to the M discrete test points;
    an N voltage measuring system coupled to the first device under test, the N voltage measuring system configured to measure the voltage potential present on the M discrete test points; and
    a processor configured to determine whether two or more conductive traces of the first device under test are shorted, wherein an alternating voltage potential that is different between the first voltage from the first voltage source and the second voltage from the second voltage source measured on the M discrete test points indicates a lack of a short of the two or more conductive traces of the first device under test, and wherein a lack of the alternating voltage potential that is different between the first voltage from the first voltage source and the second voltage from the second voltage source measured on the M discrete test points indicates the short of the two or more conductive traces of the first device under test.

2. The automated test platform of claim 1 wherein the switching sequence is a static switching sequence.

3. The automated test platform of claim 1 wherein the switching sequence is an automated switching sequence.

4. The automated test platform of claim 1 wherein the cross matrix switching system includes N cross point switches, wherein each N cross point switch is coupled to one of the N voltage sources.

5. The automated test platform of claim 4 wherein each of the N cross point switches includes M outputs, wherein each of the M outputs is selectively coupleable to the M discrete test points within the first device under test.

6. The automated test platform of claim 1 wherein the cross matrix switching system is configured to releasable engage the first device under test.

7. The automated test platform of claim 1 wherein the N voltage measuring system includes a plurality of analog-to-digital converters coupled to the M discrete test points within the first device under test.

8. The automated test platform of claim 1 wherein the N voltage measuring system is configured to releasable engage the first device under test.

9. The automated test platform of claim 1 further comprising:
    an automated DUT swap system configured to:
        uncouple the first device under test from the automated test platform, and
        couple a second device under test to the automated test platform.

10. An automated test platform for testing a first device under test, the automated test platform comprising:
    N voltage sources for providing N different voltages;
    a cross matrix switching system coupled to the N voltage sources, the cross matrix switching system configured to provide the N different voltages to M discrete test points within the first device under test, wherein M is larger than N, and wherein the N different voltages include at least a first voltage from a first voltage source of the N voltage sources and a second voltage from a second voltage source of the N voltage sources;
    an automated switch activation system configured to effectuate a switching sequence on the cross matrix switching system that selectively applies the N different voltages to the M discrete test points;
    an N voltage measuring system coupled to the first device under test, the N voltage measuring system configured to measure the voltage potential present on the M discrete test points, wherein the N voltage measuring system includes a plurality of analog-to-digital converters coupled to the M discrete test points within the first device under test; and
    a processor configured to determine whether two or more conductive traces of the first device under test are shorted, wherein an alternating voltage potential that is different between the first voltage from the first voltage source and the second voltage from the second voltage source measured on the M discrete test points indicates a lack of a short of the two or more conductive traces of the first device under test, and wherein a lack of the alternating voltage potential that is different between the first voltage from the first voltage source and the second voltage from the second voltage source measured on the M discrete test points indicates the short of the two or more conductive traces of the first device under test.

11. The automated test platform of claim 10 wherein the switching sequence is a static switching sequence.

12. The automated test platform of claim 10 wherein the switching sequence is an automated switching sequence.

13. The automated test platform of claim 10 wherein the cross matrix switching system includes N cross point switches, wherein each N cross point switch is coupled to one of the N voltage sources.

14. The automated test platform of claim 13 wherein each of the N cross point switches includes M outputs, wherein each of the M outputs is selectively coupleable to the M discrete test points within the first device under test.

15. The automated test platform of claim 10 further comprising:
    an automated DUT swap system configured to:
        uncouple the first device under test from the automated test platform, and
        couple a second device under test to the automated test platform.

16. An automated test platform for testing a first device under test, the automated test platform comprising:
    N voltage sources for providing N different voltages;
    a cross matrix switching system coupled to the N voltage sources, the cross matrix switching system configured to provide the N different voltages to M discrete test points within the first device under test, wherein M is larger than N, and wherein the N different voltages include at least a first voltage from a first voltage source of the N voltage sources and a second voltage from a second voltage source of the N voltage sources;
    an automated switch activation system configured to effectuate a switching sequence on the cross matrix switching system that selectively applies the N different voltages to the M discrete test points, wherein the switching sequence includes one of:
        a static switching sequence, and
        an automated switching sequence;
    an N voltage measuring system coupled to the first device under test, the N voltage measuring system configured to measure the voltage potential present on the M discrete test points, wherein the N voltage measuring system includes a plurality of analog-to-digital converters coupled to the M discrete test points within the first device under test;
    a processor configured to determine whether two or more conductive traces of the first device under test are shorted, wherein an alternating voltage potential that is different between the first voltage from the first voltage source and the second voltage from the second voltage source measured on the M discrete test points indicates a lack of a short of the two or more conductive traces of the first device under test, and wherein a lack of the alternating voltage potential that is different between the first voltage from the first voltage source and the second voltage from the second voltage source measured on the M discrete test points indicates the short of the two or more conductive traces of the first device under test; and
    an automated DUT swap system configured to: uncouple the first device under test from the automated test platform, and couple a second device under test to the automated test platform.

17. The automated test platform of claim 16 wherein the cross matrix switching system includes N cross point switches, wherein each N cross point switch is coupled to one of the N voltage sources.

18. The automated test platform of claim 16 wherein each of the N cross point switches includes M outputs, wherein each of the M outputs is selectively coupleable to the M discrete test points within the first device under test.

19. The automated test platform of claim 16 wherein the cross matrix switching system is configured to releasable engage the first device under test and the N voltage measuring system is configured to releasable engage the first device under test.

* * * * *